(12) United States Patent
Rhoten

(10) Patent No.: US 7,539,839 B1
(45) Date of Patent: May 26, 2009

(54) METHOD TO TEST ERROR RECOVERY WITH SELECTIVE MEMORY ALLOCATION ERROR INJECTION

(75) Inventor: George Rhoten, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/165,187

(22) Filed: Jun. 30, 2008

(51) Int. Cl.
*G06F 12/00* (2006.01)

(52) U.S. Cl. ...................................... 711/171

(58) Field of Classification Search ............ None
See application file for complete search history.

(56) References Cited

U.S. PATENT DOCUMENTS

| | | | |
|---|---|---|---|
| 5,872,910 A | 2/1999 | Kuslak et al. | |
| 6,484,276 B1 | 11/2002 | Singh et al. | |
| 6,604,211 B1 | 8/2003 | Heiman et al. | |
| 6,701,460 B1 | 3/2004 | Suwandi et al. | |
| 6,751,756 B1 | 6/2004 | Hartnett et al. | |
| 7,010,783 B2 | 3/2006 | de Jong | |
| 7,047,369 B1 | 5/2006 | Gruper et al. | |
| 7,130,786 B2 * | 10/2006 | Grebenev | 703/22 |
| 7,350,045 B2 | 3/2008 | Swafford et al. | |
| 2004/0123064 A1 | 6/2004 | Moore et al. | |
| 2005/0197815 A1 * | 9/2005 | Grebenev | 703/14 |
| 2005/0289391 A1 | 12/2005 | Ichikawa et al. | |
| 2007/0209032 A1 * | 9/2007 | Mihai et al. | 717/126 |

OTHER PUBLICATIONS

"How Fail-Stop are Faulty Processes?", Chandra et al., University of Michigan, 10 Pages, no date.
"The Systematic Improvement of Fault Tolerance in the Rio file Cache", Ng et al., University of Michigan, 8 pages, no date.
"A Flexible Generator Architecture for Improving Software Dependability", Fetzer et al., *ISSRE '02*, 12 pages, 2002.
"Inoculating Software for Survivability", Gosh et al., *Communications of the ACM*, vol. 42, No. 7, pp. 38-44, Jul. 1999.
"FIG: A Prototype Tool for Online Verification of Recovery Mechanisms", Broadwell et al., *ICS Shaman Workshop '02*, 7 pages, 2001.
"Reliability-Aware Data Placement for Partial Memory Protection in Embedded Processors", Mehrara et al., *MSPC '06*, pp. 11-18, Oct. 22, 2006.

* cited by examiner

*Primary Examiner*—Kevin Verbrugge

(57) ABSTRACT

The invention relates to a method and apparatus of simulating memory allocation errors in a software application. The method includes: determining a range of memory block sizes in a memory allocation function which results in a memory allocation failure, the range of memory block sizes defined by a first simulation criteria and including all memory block sizes between a minimum threshold and a maximum threshold; initializing an application, and simultaneously executing the memory allocation function; triggering a memory allocation failure if the application requires a memory value within the range of memory block sizes; and varying the range of memory block sizes based on a second simulation criteria, wherein the first simulation criteria and second simulation criteria are determined by a pre-determined range of memory block sizes for a memory failure simulation.

1 Claim, 3 Drawing Sheets ated to as heap management, are well known in the art and are described in any of a number of references on the C programming language and its extensions. However, the standard available solutions do not allow easy reproduction of memory allocation errors.

METHOD TO TEST ERROR RECOVERY WITH SELECTIVE MEMORY ALLOCATION ERROR INJECTION

BACKGROUND

1. Field of the Invention

The present invention relates generally to the field of memory allocation and, in particular, to the simulation of memory allocation failures based on memory sizes.

2. Description of Related Art

The need for reliable computing systems has lead to the development of "highly available" computer systems that continue to function when one or more of the subsystems or components of a computing system fail.

In order to ensure that highly available computer systems operate properly, it is necessary to perform rigorous testing. This testing is complicated by the fact that highly available computer systems typically include a large number of components and subsystems that are subject to failure. Furthermore, an operating system for a highly available computer system contains a large number of pathways to handle error conditions that must also be tested.

Some types of testing can be performed manually, for example by unplugging a computer system component, disconnecting a cable, or by pulling out a computer system board while the computer system is running. However, an outcome of this type of manual testing is typically not repeatable and is imprecise because the manual event can happen at random points in the execution path of a program or operating system that is executing on the highly available computer system.

For example, memory allocation error simulations for software applications can be difficult to reproduce. The inability to easily reproduce these errors leads to difficulties in error checking and debugging of the applications.

Current solutions that simulate memory allocation errors in software are based on memory allocation failures at certain frequencies based on time, an incremental count, or a randomly generated number. The frequency based solutions introduce too much randomness for reproducing the failure for diagnostic purposes. The frequency based error injection solutions make it difficult to reproduce errors in a multi-threaded environment.

For example, in the C programming language, applications use the function malloc( ) to allocate a piece of storage, the function free( ) to release the storage for subsequent reuse, and the function realloc( ) to change the size of a piece of storage. (The double parentheses are standard notation for C library calls.) These functions, which are sometimes referred to as heap management, are well known in the art and are described in any of a number of references on the C programming language and its extensions. However, the standard available solutions do not allow easy reproduction of memory allocation errors.

Thus, there is a need for an improved method and an apparatus that facilitates testing a computer system by injecting faults at precise locations based on the requested sizes for memory allocation in the execution path of an application that is executed on the computer system.

SUMMARY

In one embodiment, the invention relates to a method of simulating memory allocation errors in a software application, the method including: determining a range of memory block sizes in a memory allocation function which results in a memory allocation failure, the range of memory block sizes defined by a first simulation criteria and including all memory block sizes between a minimum threshold and a maximum threshold; initializing an application, and simultaneously executing the memory allocation function; triggering a memory allocation failure if the application requires a memory value within the range of memory block sizes; and varying the range of memory block sizes based on a second simulation criteria, wherein the first simulation criteria and second simulation criteria are determined by a pre-determined range of memory block sizes for a memory failure simulation.

BRIEF DESCRIPTION OF THE DRAWINGS

These and other embodiments of the invention will be discussed with reference to the following non-limiting and exemplary illustrations, in which like elements are numbered similarly, and where.

DETAILED DESCRIPTION

Figure 1:
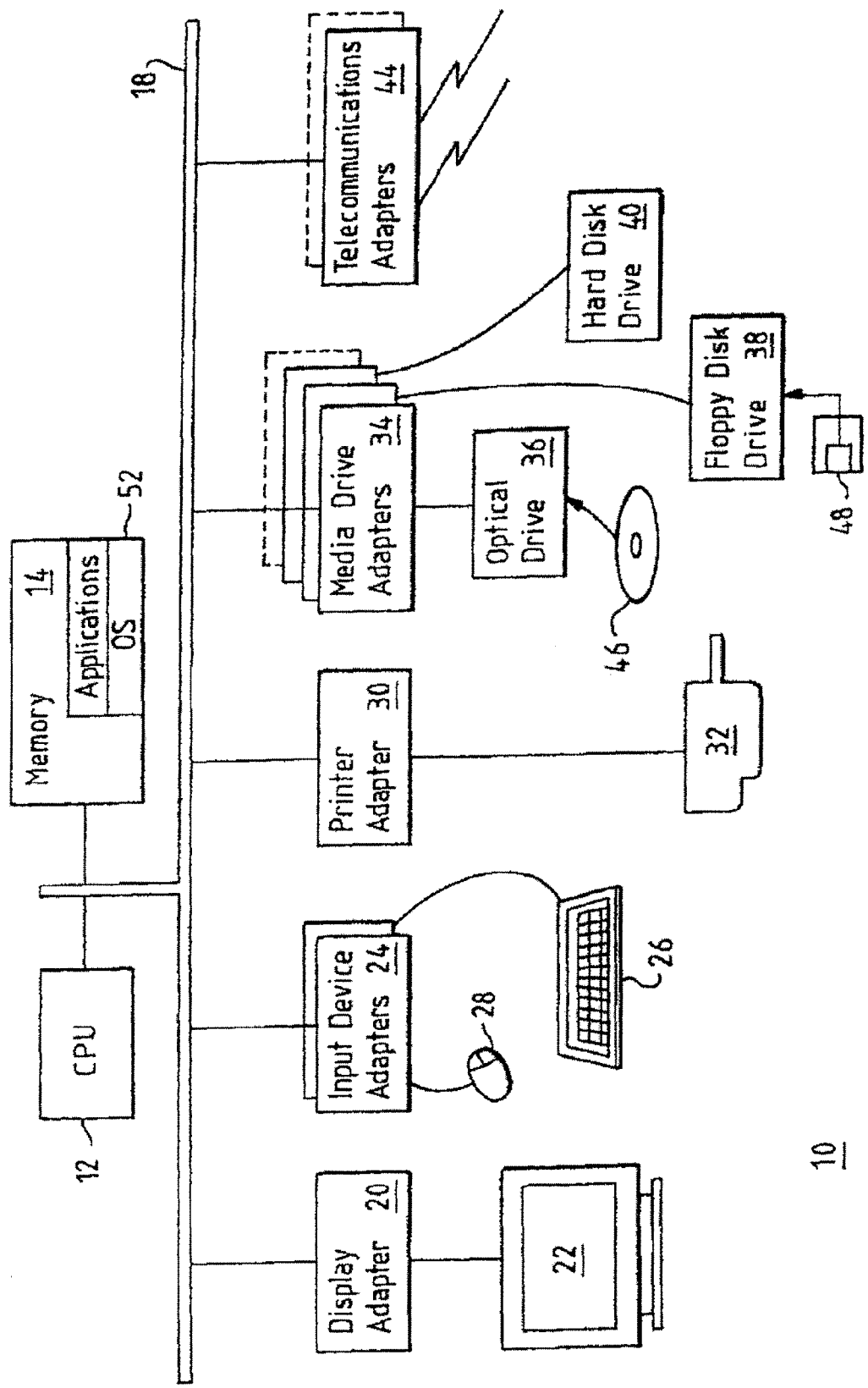
FIG. 1 depicts a block diagram of a data processing system in which the present invention can be implemented.

FIG. 1 depicts a block diagram of a data processing system in which the present invention can be implemented. Data processing system 100 includes a computer platform 104. One or more application programs 102 and an operating system 108 operate on the computer platform 104. The computer platform 104 includes a hardware unit 112. The hardware unit 112 includes one or more central processing units (CPUs) 116, a random access memory (RAM) 114 and an input/output (I/O) interface 118. Peripheral components such as a terminal 126, a data storage device 130 and a printing device 134 may be connected to the computer platform 104. An operating system 108 according to the present invention may provide a service to application programs 102 so the applications 102, through the service, may explicitly allocate and deallocate memory off of a heap.

Those of ordinary skill in the art will appreciate that the hardware and basic configuration depicted in FIG. 1 may vary. For example, other devices/components may be used in addition to or in place of the hardware depicted. The depicted example is not meant to imply architectural limitations with respect to the present invention. The presentation of a particular data processing system configuration is therefore not limiting on the scope of the invention.

A computer program for implementing various functions or for conveying information may be supplied on media such as one or more DVD/CD-ROMs and/or floppy disks and then stored on a hard disk, for example. The data processing system shown in FIG. 1 may be connected to a network such as the Internet, or a local or wide area dedicated or private network, for example.

A program that can be implemented by a data processing system may also be supplied on a telecommunications medium, for example over a telecommunications network and/or the Internet, and embodied as an electronic signal. For a data processing system operating as a wireless terminal over a radio telephone network, the telecommunications medium may be a radio frequency carrier wave carrying suitable encoded signals representing the computer program and data. Optionally, the carrier wave may be an optical carrier wave for an optical fibre link or any other suitable carrier medium for a telecommunications system.

Illustrated within memory 114 in FIG. 1 are OS 108 and application 102. Application 102 refers to one or more processes being currently run on the data processing system 100 (by a processor that is not shown). Hereinafter, the term "process" is used to refer to any program running on the data processing system. Alternatively, application 102 could refer to a process being currently run on a separate data processing system connected to the data processing system 100, and to which memory 114 is accessible. OS 108 is a software (or firmware) component of the data processing system 100 which provides an environment for the execution of programs by providing specific services to the programs including loading the programs into memory and running the programs. The OS also provides resource allocation when there are multiple users or jobs running simultaneously, including managing the sharing of internal memory among multiple applications and/or processes and handling input and output control, file and data management, communication control and related services. Application programs make requests for services to the OS through an application program interface (not shown).

Figure 2:
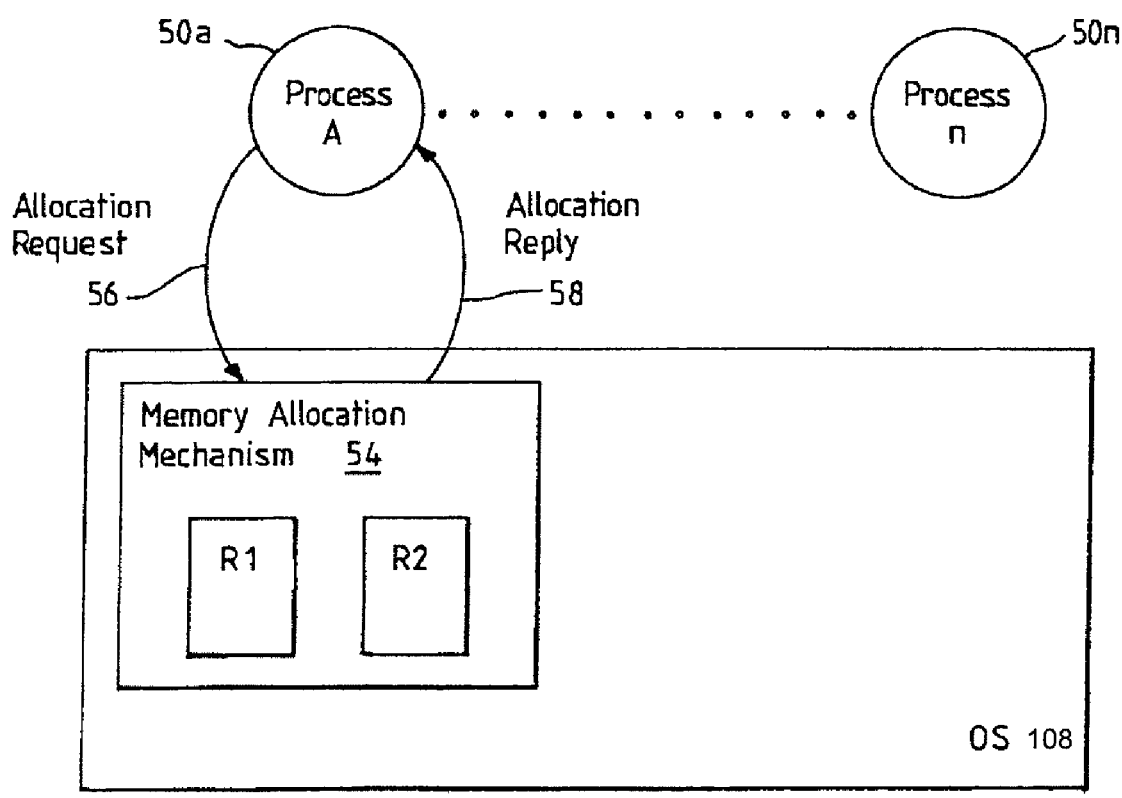
FIG. 2 is a block diagram of a process initiating a memory allocation procedure.

FIG. 2 is a block diagram of a process initiating a memory allocation procedure. There is shown a plurality of computer processes, 50a . . . 50n, interacting with an OS 108 of the data processing system 100. The OS includes a memory allocation mechanism 54 which controls the allocation of memory to processes 50a . . . 50n. The memory allocation mechanism maintains a list, R1, of available memory blocks indexed by their size and address (traditionally the address of the first byte of the available block), and a list R2, of unavailable or allocated memory blocks. Herein, the term "block" is used to refer to any sized block of memory including a single byte of memory. The memory allocation mechanism may allocate blocks of physical memory or areas of a virtual memory which can be translated into a physical memory block by a memory mapping, as is well known in the art.

Figure 3:
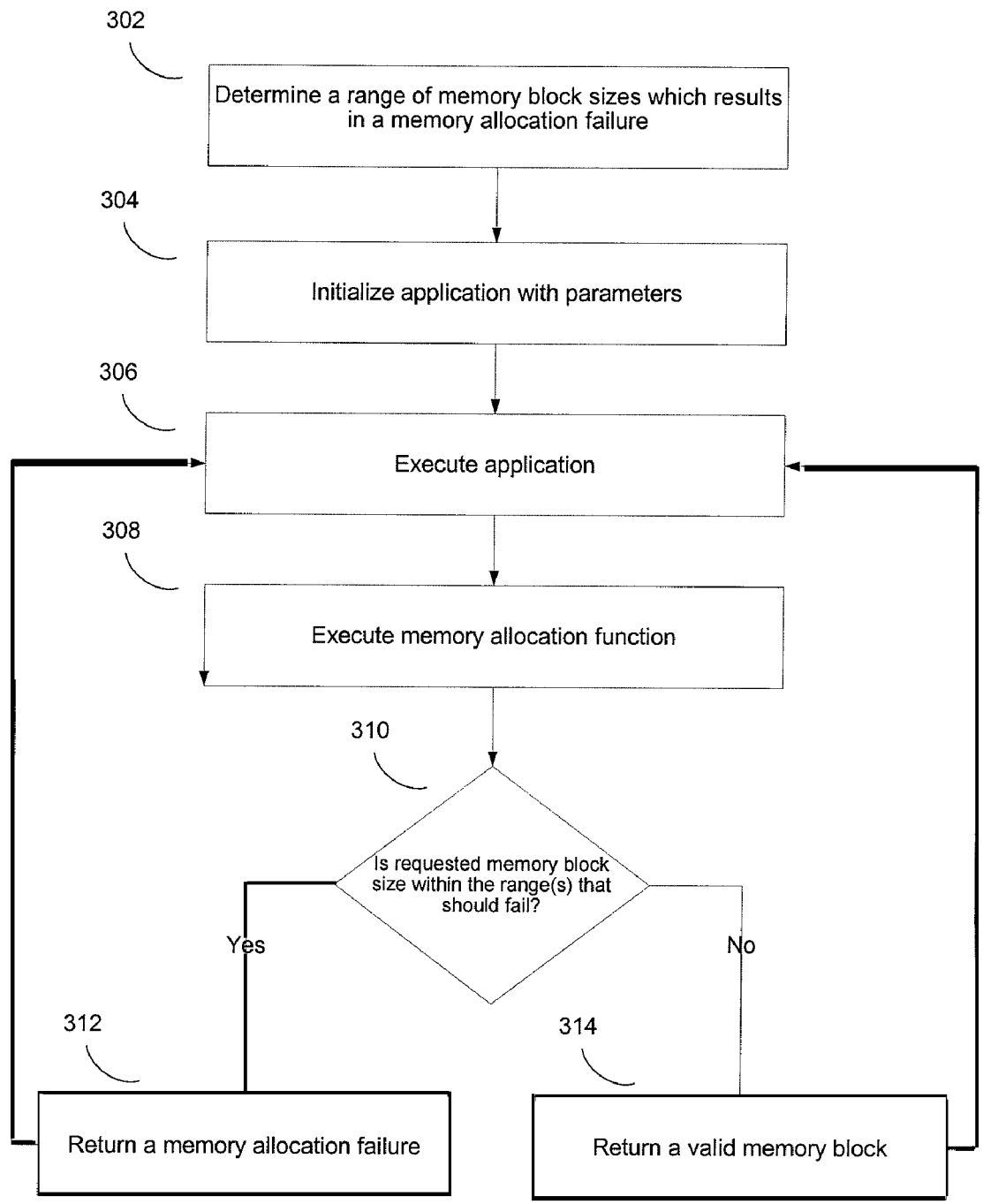
FIG. 3 is a flowchart illustrating the process of simulating a memory allocation failure according to an embodiment of the present invention.

FIG. 3 is a flowchart illustrating the process of simulating a memory allocation failure according to an embodiment of the present invention. Those skilled in the art will appreciate from the following description that although the steps comprising the flowchart are illustrated in a sequential order, many of the steps illustrated in FIG. 3 can be performed concurrently or in an alternative order.

At step 302, a range of memory block sizes which results in a memory allocation failure is determined. The range of memory block sizes can be specified in a memory allocation function, such as a malloc( ) function in the C programming language. This function may be written in a number of programming languages, including, but not limited to, C++, Java, FORTRAN, Cobol, Pascal, and any other programming language known to one skilled in the art. Below is a simple example of a malloc( ) function written in the C programming language that specifies a memory size range of memory allocation failure:

```
#include <stdlib.h>
size_t MIN_MEMORY_SIZE_FAILURE;
size_t MAX_MEMORY_SIZE_FAILURE;
void *libMalloc(size_t size) {
    if (MIN_MEMORY_SIZE_FAILURE <=size && size
        <=MAX_MEMORY_SIZE_FAILURE)
    {
      return NULL;
    }
    return malloc(size);
}
void libFree(void *men) {
    free(mem);
}
int main(int argc, const char* const argv[ ])
{
    /*
    If MIN_MEMORY_SIZE_FAILURE is set to 11 and
       MAX_MEMORY_SIZE_FAILURE is set to 999, the
       second malloc will fail, while allowing the other two
       allocations to succeed.
    /*
    char *chunk1=(char *)libMalloc(10);
    char *chunk2=(char *)libMalloc(100);
    char *chunk3=(char *)libMalloc(1000);
    /* Insert code here to handle allocation failure and
       respond accordingly. */
    libFree(chunk1);
    libFree(chunk2);
    libFree(chunk3);
    return 0;
}
```

MIN_MEMORY_SIZE_FAILURE and MAX_MEMORY_SIZE_FAILURE values can be set within the function to specify the range of memory sizes which result in a memory allocation failure. The range of memory failures is a predetermined range of memory block sizes based on simulation criteria for which a failure is being conducted.

In an embodiment of the invention, the range of memory sizes which result in a memory allocation failure can be inclusive of the MIN_MEMORY_SIZE_FAILURE and MAX_MEMORY_SIZE_FAILURE values.

In another embodiment of the invention, the range of memory sizes which result in a memory allocation failure can be exclusive of the MIN_MEMORY_SIZE_FAILURE and MAX_MEMORY_SIZE_FAILURE values. Thus, the condition for a failure is inversed, and all memory sizes outside of the defined range will result in a memory allocation failure.

In step 304, the application is initialized. The application can be initialized manually or automatically based on an input or pre-defined script.

In step 306, the application is executed. In step 308, the memory allocation function, such as the malloc( ) function above, is executed so that that the requested memory sizes for the application are read through the function.

In an embodiment of the present invention, the invention can be used in a multithreaded application where step 306 and step 308 can occur concurrently with each other. In a single threaded application, step 306 and step 308 occur sequentially as described above.

At step 310, the function determines if the requested memory size for the application is within the MIN_MEMORY_SIZE_FAILURE and MAX_MEMORY_SIZE_FAILURE values defined in the function. In the malloc( ) function above, the determination is made by the following lines of code, where a "NULL" value results in an error or failure in memory allocation.

```
if (MIN_MEMORY_SIZE_FAILURE <=size && size
    <=MAX_MEMORY_SIZE_FAILURE){return NULL;
}
```

If the requested memory size is within the specified range, the process continues to step 312, where a memory allocation failure is returned. However, if the requested memory size is not within the specified range, then the application does not return a memory allocation failure, and a valid memory block is returned at step 314.

By varying the MIN_MEMORY_SIZE_FAILURE and MAX_MEMORY_SIZE_FAILURE values in the function, various ranges of sizes can be used to test for error handling during memory allocation failures. Furthermore, the range can remain the same, allowing a modification to the system or another area of the software which may affect error handling or performance of the application. The variation of the memory size ranges can be based on a pre-determined range of memory block sizes based on simulation criteria for which a failure is being conducted.

In an embodiment of the present invention, multiple memory size ranges can be specified within the function. This allows multiple size ranges to trigger failures, and error handling of an application can be observed for multiple concurrent size requests.

While the specification has been disclosed in relation to the exemplary and non-limiting embodiments provided herein, it is noted that the inventive principles are not limited to these embodiments and include other permutations and deviations without departing from the spirit of the invention.

What is claimed is:

1. A method of simulating memory allocation errors in a software application, the method including:
   determining a range of memory block sizes in a memory allocation function which results in a memory allocation failure, the range of memory block sizes defined by a first simulation criteria and including all memory block sizes between a minimum threshold and a maximum threshold;
   initializing an application, and simultaneously executing the memory allocation function;
   triggering a memory allocation failure if the application requires a memory value within the range of memory block sizes; and
   varying the range of memory block sizes based on a second simulation criteria,
   wherein the first simulation criteria and second simulation criteria are determined by a pre-determined range of memory block sizes for a memory failure simulation.

* * * * *